(12) United States Patent
Tavakol et al.

(10) Patent No.: US 10,840,914 B1
(45) Date of Patent: Nov. 17, 2020

(54) PROGRAMMABLE FREQUENCY DIVIDER

(71) Applicant: Dialog Semiconductor B.V., 's-Hertogenbosch (NL)

(72) Inventors: Armin Tavakol, 's Hertogenbosch (NL); Johannes Gerardus Willms, Oosterhout (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/558,390

(22) Filed: Sep. 3, 2019

(51) Int. Cl.
*H03K 23/66* (2006.01)

(52) U.S. Cl.
CPC .................. *H03K 23/667* (2013.01)

(58) Field of Classification Search
CPC ..................................... H03K 23/667
USPC .............. 327/113, 114, 115, 116, 117
See application file for complete search history.

(56) References Cited

U.S. PATENT DOCUMENTS

2011/0012647 A1* 1/2011 Qiao ............... H03K 21/00 327/117

OTHER PUBLICATIONS

"Fully Integrated 5.35-GHz CMOS VCOs and Prescalers," by Chih-Ming Hung et al., IEEE Transactions on Microwave Theory and Techniques, vol. 49, No. 1, Jan. 2001, pp. 17-22.

"CMOS High-Speed 1/14 Dynamic Frequency Divider," by Queennie Lim Suan Imm et al., 2006 International RF and Microwave Conference Proceedings, Sep. 12-14, 2006, Putrajaya, Malaysia, pp. 220-224.

"A 15-GHz broad-band ÷ 2 frequency divider in 0.13-μm CMOS for quadrature generation," by Andrea Giovanni Bonfanti et al., ResearchGate, IEEE Microwave and Wireless Components Letters 15(11):724-726, Dec. 2005.

* cited by examiner

*Primary Examiner* — John W Poos
(74) *Attorney, Agent, or Firm* — Saile Ackerman LLC; Stephen B. Ackerman

(57) ABSTRACT

A frequency divider unit to receive an oscillating signal and to update, at an output of the frequency divider unit, a frequency-divided oscillating signal is presented. The frequency divider unit has a first clocked signal inverter to update, clocked based on the oscillating signal, a first intermediate signal at an output of the first clocked signal inverter. The frequency divider unit has a second clocked signal inverter, wherein the output of the first clocked signal inverter may be connected to an input of the second clocked signal inverter, and wherein the second clocked signal inverter updates, clocked based on the oscillating signal, a second intermediate signal at an output of the second clocked signal inverter. The frequency divider unit has a continuously operating signal inverter coupled between the output of the second clocked signal inverter and the input of the first clocked signal inverter.

8 Claims, 11 Drawing Sheets

Self Resonance Frequency = $\dfrac{1}{2 \times n \times t_{delay}}$ n = Number of Inverters

PROGRAMMABLE FREQUENCY DIVIDER

TECHNICAL FIELD

The present document relates to frequency dividers for radio frequency (RF) applications.

In particular, the present document relates to frequency dividers with programmable division ratios.

BACKGROUND

Mobile communication devices are typically required to support a plurality of radio communication standards, such as e.g. the Bluetooth, Wireless Local Area Network (WLAN), ZigBee, Global Positioning System (GPS) or Long-Term Evolution (LTE) standard. At this, each radio communication standard requires a dedicated frequency range. It is desirable to equip a mobile communication device with a single oscillator core to generate a base frequency or a base frequency band, and to derive additional frequencies or additional frequency bands with the help of dedicated frequency divider circuits.

SUMMARY

The present document addresses the above-mentioned technical problems. In particular, the present document addresses the technical problem of providing a power and area efficient frequency divider circuit with a programmable (or adjustable) division ratio such that the generated oscillation signals may be used for a plurality of radio communication standards.

According to an aspect, a frequency divider unit is presented. The frequency divider unit is configured to receive an oscillating signal and to generate, at an output of the frequency divider unit, a frequency-divided oscillating signal. The frequency divider unit may comprise a first clocked signal inverter configured to update, clocked based on the oscillating signal, a first intermediate signal at an output of the first clocked signal inverter, wherein said first intermediate signal is an inverted version of a binary signal at an input of the first clocked signal inverter. For example, said first intermediate signal may be an inverted and time-delayed version of the binary signal at the input of the first clocked signal inverter. The frequency divider unit may comprise a second clocked signal inverter, wherein the output of the first clocked signal inverter may be connected to an input of the second clocked signal inverter, and wherein the second clocked signal inverter may be configured to update, clocked based on the oscillating signal, a second intermediate signal at an output of the second clocked signal inverter, wherein said second intermediate signal is an inverted version of the first intermediate signal at the input of the second clocked signal inverter. For example, the second intermediate signal may be an inverted and time-delayed version of the first intermediate signal at the input of the second clocked signal inverter. The frequency divider unit may comprise a continuously operating signal inverter coupled between the output of the second clocked signal inverter and the input of the first clocked signal inverter.

The oscillating signal may be a periodical signal with discrete or continuous signal values. For instance, the oscillating signal may be a pulse shaped binary signal which alternates between a logical high value and a logical low value. Alternatively, the oscillating signal may be a signal with continuous signal values which oscillate around a mean value, such as e.g. a sine wave signal. The frequency-divided oscillating signal may be provided at the output of the frequency divider unit which may be e.g. connected to the input of the first clocked signal inverter.

The described frequency divider unit is capable of dividing a frequency of the oscillating signal by a factor of 2. The described frequency divider unit may be extended to a frequency divider with any even division ratio. In general, the described frequency divider unit may form part of a programmable frequency divider with an arbitrary division ratio.

The continuously operating signal inverter may be configured to continuously update the binary signal at the input of the first clocked signal inverter, wherein said binary signal is an inverted version of the second intermediate signal at the output of the second clocked signal inverter. For instance, the continuously operating signal inverter may comprise a p-channel metal-oxide-semiconductor field effect transistor (MOSFET) and an n-channel MOSFET connected in series between a terminal at a logical high value (such as e.g. a supply terminal) and a terminal at a logical low value (such as e.g. a reference terminal or ground). In contrast to the clocked signal inverters, the continuously operating signal inverter continuously inverts a signal at its input and provides the inverted result at its output.

According to a first alternative, the frequency divider unit may be configured to update, using the first clocked signal inverter, the first intermediate signal (only) when a rising edge of the oscillating signal occurs, and to update, using the second clocked signal inverter, the second intermediate signal (only) when a falling edge of the oscillating signal occurs. According to a second alternative, the frequency divider unit may be configured to update, using the first clocked signal inverter, the first intermediate signal (only) when a falling edge of the oscillating signal occurs, and to update, using the second clocked signal inverter, the second intermediate signal (only) when a rising edge of the oscillating signal occurs.

In the present document, the verb "update" is used in connection with the clocked generation of intermediate signals (such as e.g. the first intermediate signal and the second intermediate signal) to indicate a time discrete generation of the intermediate signals at times when the oscillation signal (periodically) meets a certain condition. However, it should be noted that the verb "update" could as well be replaced by the verb "generate". After the intermediate signals have been generated once (i.e. after a first initialization of the intermediate signals), the existing intermediate signals are updated or refreshed by the respective clocked signal inverters. The respective clocked signal inverter may be configured to generate/update the respective intermediate signal only at times when a rising or falling edge of the oscillating signal occurs, and to maintain (like a sample-and-hold circuit) the respective intermediate signal at a constant signal level in the absence of rising or falling edges. In other words, the result of the inversion process may be only propagated to the output of the respective clocked signal inverter when the oscillation signal meets a certain condition (e.g. reaches a certain signal value, or shows a rising or falling edge).

The first clocked signal inverter may be configured to update the first intermediate signal (only) when the oscillating signal reaches a first signal value, and the second clocked signal inverter may be configured to update the second intermediate signal (only) when an inverted oscillating signal reaches a second signal value. The inverted oscillating signal may be an inverted version of the oscillating signal.

For example, the frequency divider unit may comprise a continuously operating oscillating signal inverter configured to continuously update said inverter oscillating signal based on said oscillating signal. Alternatively, said inverted oscillating signal may be provided to the frequency divider unit from an external device. The first signal value may be equal to the second signal value.

Both the first and the second clocked signal inverter may be implemented using suitable clocked flipflops, such as e.g. a D-flipflops. Preferably, both the first and the second clocked signal inverter may be implemented using high-speed flipflops. For example, the first clocked signal inverter may comprise a first switch and a first continuously operating inverter arranged in series, and the second clocked signal inverter may comprise a second switch and a second continuously operating inverter arranged in series. The oscillating signal may be applied to the first switch and the inverted oscillating may be applied to the second switch.

The first continuously operating inverter may comprise a p-channel MOSFET and an n-channel MOSFET connected in series between a terminal at a logical high value (such as e.g. a supply terminal) and a terminal at a logical low value (such as e.g. a reference terminal or ground). Analogously, the second continuously operating inverter may comprise a p-channel MOSFET and an n-channel MOSFET connected in series between the terminal at a logical high value and the terminal at a logical low value. The first switch may be implemented using one or more transistors. Similarly, the second switch may be implemented using one or more transistors.

The frequency divider unit may comprise a third clocked signal inverter configured to update, clocked based on the oscillating signal, a third intermediate signal, wherein said third intermediate signal is an inverted version of the second intermediate signal. In addition, the frequency divider unit may comprise a fourth clocked signal inverter configured to update, clocked based on the oscillating signal, a fourth intermediate signal, wherein said fourth intermediate signal is an inverted version of the third intermediate signal. The continuously operating signal inverter may be configured to continuously update the binary signal at the input of the first clocked signal inverter, wherein said binary signal is an inverted version of the fourth intermediate signal. The described frequency divider circuit is e.g. capable of dividing a frequency of the oscillating signal by a factor of 4.

According to a first alternative, the frequency divider unit may be configured to update, using the first and the third clocked signal inverter, the first and the third intermediate signal, respectively, when a rising edge of the oscillating signal occurs, and to update, using the second and fourth clocked signal inverter, the second and the fourth intermediate signal, respectively, when a falling edge of the oscillating signal occurs. According to a second alternative, the frequency divider unit may be configured to update, using the first and third clocked signal inverter, the first and third intermediate signal, respectively, when a falling edge of the oscillating signal occurs, and to update, using the second and fourth clocked signal inverter, the second and fourth intermediate signal, respectively, when a rising edge of the oscillating signal occurs.

The first and the third clocked signal inverter may be configured to update the first and the third intermediate signal, respectively, (only) when the oscillating signal reaches a first signal value. The second and the fourth clocked signal inverter may be configured to update the second and the fourth intermediate signal, respectively, (only) when an inverted oscillating signal reaches a second signal value, wherein the inverted oscillating signal is an inverted version of the oscillating signal. Again, the frequency divider unit may comprise a continuously operating oscillating signal inverter configured to continuously update said inverter oscillating signal based on said oscillating signal. Alternatively, said inverted oscillating signal may be provided to the frequency divider unit from an external device. Moreover, the first signal value may be equal to the second signal value.

The first clocked signal inverter may comprise a first switch and a first continuously operating inverter arranged in series. The second clocked signal inverter may comprise a second switch and a second continuously operating inverter arranged in series. The third clocked signal inverter may comprise a third switch and a third continuously operating inverter arranged in series. The fourth clocked signal inverter may comprise a fourth switch and a fourth continuously operating inverter arranged in series. The oscillating signal may be applied to the first switch and the third switch, and the inverted oscillating may be applied to the second switch and the fourth switch.

According to a further aspect, another frequency divider unit is presented. This frequency divider unit may be configured to receive an oscillating signal and to update, at an output of the frequency divider unit, a frequency-divided oscillating signal. The frequency divider unit may comprise a first clocked signal inverter configured to update, clocked based on the oscillating signal, a first intermediate signal, wherein said first intermediate signal is an inverted version of a binary signal at an input of the first clocked signal inverter. The frequency divider unit may comprise a second clocked signal inverter configured to update, clocked based on the oscillating signal, a second intermediate signal at an output of the second clocked signal inverter, wherein said second intermediate signal is an inverted version of the first intermediate signal. Furthermore, the frequency divider unit may comprise a third clocked signal inverter coupled between the output of the second clocked signal inverter and the input of the first clocked signal inverter. The third clocked signal inverter may be configured to update, clocked based on the oscillating signal, a third intermediate signal at an output of the third clocked signal inverter, wherein said third intermediate signal is an inverted version of the second intermediate signal.

The frequency divider unit may comprise a control unit configured to receive the third intermediate signal and to determine, based on said third intermediate signal, whether the oscillating signal or an inverted oscillating signal is forwarded to the first clocked signal inverter, wherein the inverted oscillating signal is an inverted version of the oscillating signal. The first clocked signal inverter may be configured to update, if the oscillating signal is forwarded by the control unit, the first intermediate signal (only) when the oscillating signal reaches a first signal value. Alternatively, the first clocked signal inverter may be configured to update, if the inverted oscillating signal is forwarded by the control unit, the first intermediate signal (only) when the inverted oscillating signal reaches a second signal value.

Again, the frequency divider unit may comprise a continuously operating oscillating signal inverter configured to continuously update said inverter oscillating signal based on said oscillating signal. Alternatively, said inverted oscillating signal may be provided to the frequency divider unit from an external device. The first signal value may be equal to the second signal value.

The control unit may comprise a multiplexer configured to receive both the oscillating signal and the inverted oscillating signal, and to determine, based on the third intermediate signal, whether the oscillating signal or the inverted oscillating signal is forwarded to the first clocked signal inverter. The frequency divider unit may further comprise a variable delay unit which is coupled between the third clocked signal inverter and the first clocked signal inverter. A delay generated by the variable delay unit may be helpful to compensate for the delay introduced by the control unit, and in particular for the delay introduced by the multiplexer.

Moreover, the control unit may be configured to receive the third intermediate signal and to determine, based on said third intermediate signal, whether the oscillating signal or an inverted oscillating signal is forwarded to the second and third clocked signal inverters.

The second clocked signal inverter may be configured to generate, if the oscillating signal is forwarded by the control unit, the second intermediate signal (only) when the oscillating signal reaches the first signal value. Alternatively, the second clocked signal inverter may be configured to generate, if the inverted oscillating signal is forwarded by the control unit, the second intermediate signal (only) when the inverted oscillating signal reaches the second signal value.

The third clocked signal inverter may be configured to generate, if the oscillating signal is forwarded by the control unit, the third intermediate signal (only) when the oscillating signal reaches the first signal value. Alternatively, the third clocked signal inverter may be configured to generate, if the inverted oscillating signal is forwarded by the control unit, the third intermediate signal (only) when the inverted oscillating signal reaches the second signal value.

The above-described frequency divider unit is capable of dividing a frequency of the oscillating signal by a factor of 3. The described frequency divider unit may be extended to a frequency divider with an odd division ratio. In general, the described frequency divider unit may form part of a programmable frequency divider with an arbitrary division ratio.

Alternatively or additionally, the frequency divider unit may comprise a state control unit configured to switch between a first switching state and a second switching state. In the first switching state, the first and the third clocked signal inverter are clocked by the oscillating signal such that both the first and the third clocked signal inverter are configured to update the first and the third intermediate signal, respectively, when the oscillating signal reaches a threshold signal value. Still in the first switching state, the second clocked signal inverter is clocked by an inverted oscillating signal such that the second clocked signal inverter is configured to update the second intermediate signal when the inverted oscillating signal reaches the threshold signal value. In the second switching state, the first and the third clocked signal inverter are clocked by the inverted oscillating signal such that both the first and the third clocked signal inverter are configured to update the first and the third intermediate signal, respectively, when the inverted oscillating signal reaches the threshold signal value. Still in the second switching state, the second clocked signal inverter is clocked by the oscillating signal such that the second clocked signal inverter is configured to update the second intermediate signal when the oscillating signal reaches the threshold signal value. The inverted oscillating signal may be an inverted version of the oscillating signal.

For example, the state control unit may be configured to receive the third intermediate signal and to switch between the first switching state and the second switching state based on said third intermediate signal.

According to further aspects, methods for dividing a frequency are described. The methods may comprise steps which correspond to the features of the frequency divider units described in the present document.

According to an aspect, a method for dividing a frequency comprises receiving an oscillating signal. The method may comprise updating, by a first clocked signal inverter, clocked based on the oscillating signal, a first intermediate signal at an output of the first clocked signal inverter, wherein said first intermediate signal is an inverted version of a binary signal at an input of the first clocked signal inverter. The method may comprise updating, by a second clocked signal inverter, clocked based on the oscillating signal, a second intermediate signal at an output of the second clocked signal inverter, wherein said second intermediate signal is an inverted version of the first intermediate signal. The method may comprise coupling a continuously operating signal inverter between the output of the second clocked signal inverter and the input of the first clocked signal inverter.

Further, the method may comprise continuously updating, by the continuously operating signal inverter, the binary signal at the input of the first clocked signal inverter, wherein said binary signal is an inverted version of the second intermediate signal at the output of the second clocked signal inverter.

The method may comprise updating, using the first clocked signal inverter, the first intermediate signal when a rising edge of the oscillating signal occurs, and updating, using the second clocked signal inverter, the second intermediate signal when a falling edge of the oscillating signal occurs. The method may comprise updating, using the first clocked signal inverter, the first intermediate signal when a falling edge of the oscillating signal occurs, and updating, using the second clocked signal inverter, the second intermediate signal when a rising edge of the oscillating signal occurs.

The method may comprise updating, by the first clocked signal inverter, the first intermediate signal when the oscillating signal reaches a first signal value. The method may comprise updating, by the second clocked signal inverter, the second intermediate signal when an inverted oscillating signal reaches a second signal value, wherein the inverted oscillating signal is an inverted version of the oscillating signal.

The first clocked signal inverter may comprise a first switch and a first continuously operating inverter arranged in series, and the second clocked signal inverter may comprise a second switch and a continuously operating continuous inverter arranged in series. In this scenario, the method may comprise applying the oscillating signal to the first switch, and applying the inverted oscillating to the second switch.

The method may comprise updating, by a third clocked signal inverter, clocked based on the oscillating signal, a third intermediate signal, wherein said third intermediate signal is an inverted version of the second intermediate signal. The method may comprise updating, by a fourth clocked signal inverter, clocked based on the oscillating signal, a fourth intermediate signal, wherein said fourth intermediate signal is an inverted version of the third intermediate signal. The method may comprise continuously updating, by the continuously operating signal inverter, the binary signal at the input of the first clocked signal inverter, wherein said binary signal is an inverted version of the fourth intermediate signal.

The method may comprise updating, using the first and the third clocked signal inverter, the first and the third intermediate signal, respectively, when a rising edge of the oscillating signal occurs, and updating, using the second and fourth clocked signal inverter, the second and the fourth intermediate signal, respectively, when a falling edge of the oscillating signal occurs. Alternatively, the method may comprise updating, using the first and third clocked signal inverter, the first and third intermediate signal, respectively, when a falling edge of the oscillating signal occurs, and updating, using the second and fourth clocked signal inverter, the second and fourth intermediate signal, respectively, when a rising edge of the oscillating signal occurs.

The method may comprise updating, by the first and the third clocked signal inverter, the first and the third intermediate signal, respectively, when the oscillating signal reaches a first signal value. The method may comprise updating, by the second and the fourth clocked signal inverter, the second and the fourth intermediate signal, respectively, when an inverted oscillating signal reaches a second signal value, wherein the inverted oscillating signal is an inverted version of the oscillating signal.

The first clocked signal inverter may comprise a first switch and a first continuously operating inverter arranged in series, the second clocked signal inverter may comprise a second switch and a second continuously operating inverter arranged in series, the third clocked signal inverter may comprise a third switch and a third continuously operating inverter arranged in series, the fourth clocked signal inverter may comprise a fourth switch and a fourth continuously operating inverter arranged in series. The method may comprise applying the oscillating signal to the first switch and the third switch, and applying the inverted oscillating to the second switch and the fourth switch.

According to yet another aspect, a further method for dividing a frequency is presented. This method may comprise receiving an oscillating signal. The method may comprise updating, by a first clocked signal inverter, clocked based on the oscillating signal, a first intermediate signal, wherein said first intermediate signal is an inverted version of a binary signal at an input of the first clocked signal inverter. The method may comprise updating, by a second clocked signal inverter, clocked based on the oscillating signal, a second intermediate signal at an output of the second clocked signal inverter, wherein said second intermediate signal is an inverted version of the first intermediate signal. The method may comprise updating, by a third clocked signal inverter which is coupled between the output of the second clocked signal inverter and the input of the first clocked signal inverter, clocked based on the oscillating signal, a third intermediate signal at an output of the third clocked signal inverter, wherein said third intermediate signal is an inverted version of the second intermediate signal.

The method may comprise receiving, by a control unit, the third intermediate signal. The method may comprise determining, by the control unit, based on said third intermediate signal, whether the oscillating signal or an inverted oscillating signal is forwarded to the first clocked signal inverter, wherein the inverted oscillating signal is an inverted version of the oscillating signal. The method may comprise updating, by the first clocked signal inverter, if the oscillating signal is forwarded by the control unit, the first intermediate signal when the oscillating signal reaches a first signal value. The method may comprise updating, by the first clocked signal inverter, if the inverted oscillating signal is forwarded by the control unit, the first intermediate signal when the inverted oscillating signal reaches a second signal value.

If said control unit comprises a multiplexer, the method may comprise receiving, by said multiplexer, both the oscillating signal and the inverted oscillating signal. The method may comprise determining, by said multiplexer, based on the third intermediate signal, whether the oscillating signal or the inverted oscillating signal is forwarded to the first clocked signal inverter.

The method may comprise coupling a variable delay unit between the third clocked signal inverter and the first clocked signal inverter. This delay is needed to compensate for the delay introduced by the multiplexer.

Moreover, the method may comprise switching, by a state control unit, between a first switching state and a second switching state. In the first switching state the first and the third clocked signal inverter are clocked by the oscillating signal such that both the first and the third clocked signal inverter update the first and the third intermediate signal, respectively, when the oscillating signal reaches a threshold signal value. Still in the first switching state, the second clocked signal inverter is clocked by an inverted oscillating signal such that the second clocked signal inverter updates the second intermediate signal when the inverted oscillating signal reaches the threshold signal value. In the second switching state, the first and the third clocked signal inverter are clocked by the inverted oscillating signal such that both the first and the third clocked signal inverter update the first and the third intermediate signal, respectively, when the inverted oscillating signal reaches the threshold signal value. Still in the second switching state, the second clocked signal inverter is clocked by the oscillating signal such that the second clocked signal inverter updates the second intermediate signal when the oscillating signal reaches the threshold signal value. The inverted oscillating signal may be an inverted version of the oscillating signal.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE FIGURES

The present invention is illustrated by way of example, and not by way of limitation, in the figures of the accompanying drawings in which like reference numerals refer to similar or identical elements, and in which.

DESCRIPTION

Figure 1:
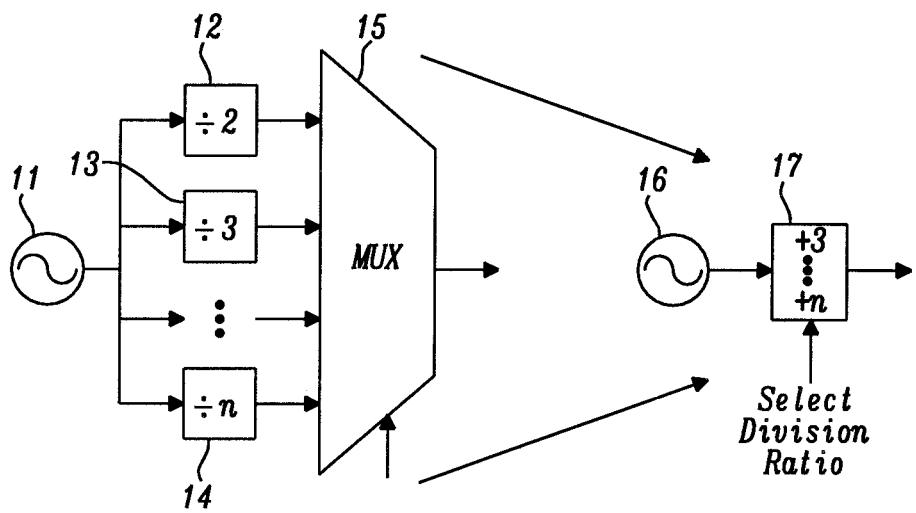
FIG. 1 shows the basic idea of merging a plurality of frequency dividers into a single, programmable frequency divider unit.

Typically, a mobile communication device includes at least one oscillator core for generating an oscillating signal for RF applications such as e.g. Bluetooth or WLAN. As illustrated in FIG. 1, such an oscillator 11 may comprise e.g. a resonant circuit comprising a coil/inductor and a capacitor. With the help of a plurality of frequency dividers 12, 13, 14 and a multiplexer 15, a scaled version of said oscillation signal may be generated as required by the individual RF applications. However, using the plurality of frequency dividers 12, 13, 14 together with multiplexer 15 represents neither cost nor power efficient solution.

FIG. 1 shows the basic idea of merging a plurality of frequency dividers 12, 13, 14 into a single, programmable frequency divider unit 17. The idea of a programmable frequency divider 17 is to have multiple frequency division ratios and being able to program the divider to operate at each. In this way, we can merge series frequency dividers into one divider as indicated in FIG. 1. Frequency divider 17 may be used in the frequency synthesizer block inside a radio and may be connected directly, or via a buffer, to an oscillator 16.

Figure 2:
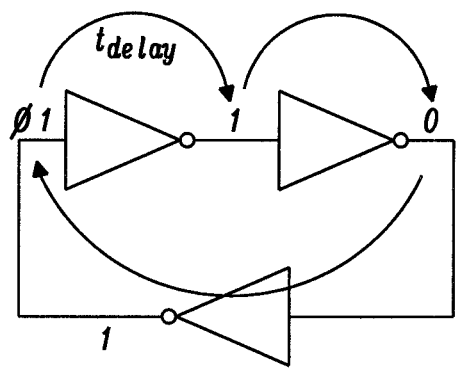
FIG. 2 shows an exemplary ring oscillator.

We can explain the functionality of the programmable frequency divider by first considering a ring oscillator, for which a simplified version is given in FIG. 2. The self-resonance frequency SRF of this ring oscillator is given by the equation below the circuit diagram. It is defined by the time dt, of each inverter and the number of inverters in the forward path. By following the arrows, we can identify the basic operation of the ring oscillator.

Figure 3:
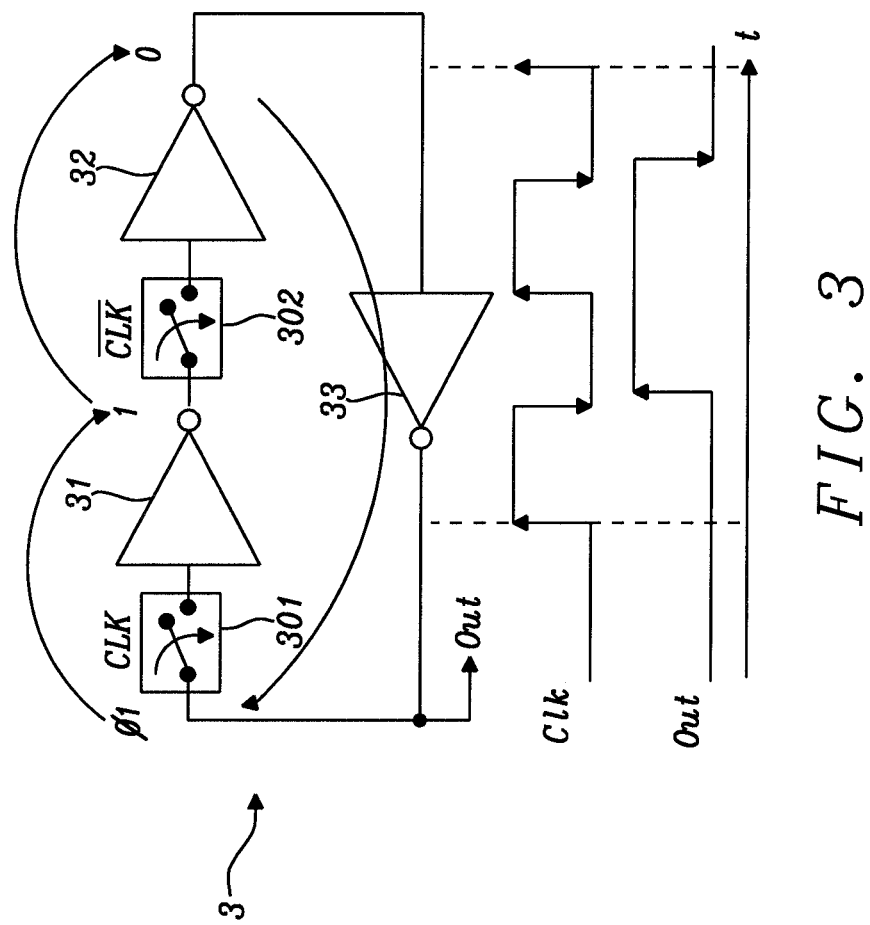
FIG. 3 shows an exemplary clocked ring oscillator.

As illustrated in FIG. 3, we can create a clocked version of the ring oscillator of FIG. 2 by adding switches 301 and 302, which are driven by an oscillation signal called CLK. This CLK signal may have a pulse shape (rail-to-rail) or may be a sine wave e.g. with limited amplitude. As illustrated in FIG. 3, the CLK signal is applied to the first switch 301 located at the input of inverter 31, whereas an inverted CLK signal denoted as $\overline{CLK}$ is applied to the second switch 302 located at the input of inverter 32. The first switch 301 in combination with inverter 31 forms a first clocked signal inverter which is clocked by the oscillating signal $\overline{CLK}$. Analogously, the second switch 302 in combination with inverter 32 forms a second clocked signal inverter which is clocked by the inverter oscillating signal CLK. A continuously operating inverter 33 continuously inverts the signal at the output of switch 32 and provides the result to the input of the first switch 301, wherein said input is at the same time the output of the exemplary frequency divider unit 3 in FIG. 3. The output signal at the output of the exemplary frequency divider unit 3 is denoted as "Out" in FIG. 3.

Let's assume the output signal "Out"='O'. At the rising edge of "CLK", the output of the first inverter 31 will go to '1'. At the falling edge of "CLK", the second inverter 32 will be enabled, and its output will go to 'O'. The output signal "Out" will now become '1' due to the feedback inverter at the bottom. As a result, the frequency of the output signal "Out" is now half the frequency of the "CLK" signal.

Figure 4:
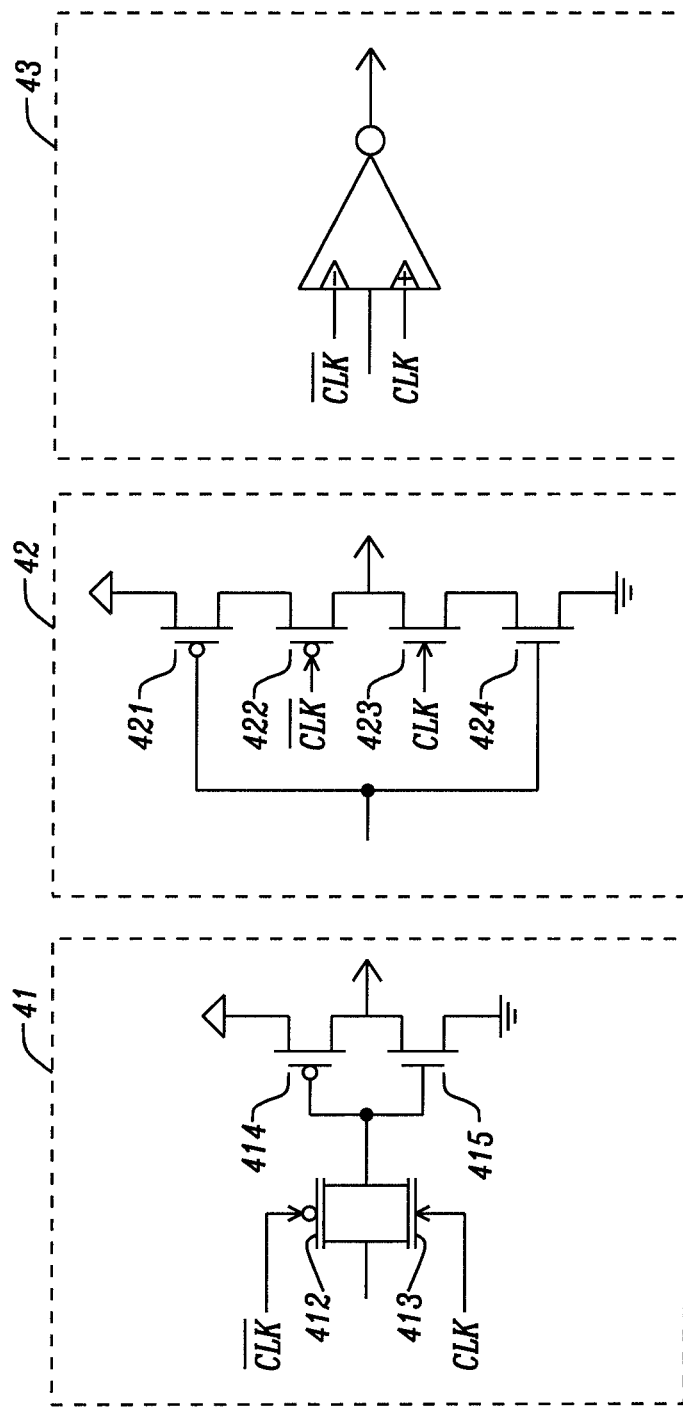
FIG. 4 shows two exemplary implementations of a clocked signal inverter and a corresponding equivalent circuit diagram of a clocked signal inverter.

FIG. 4 shows two exemplary implementations of a clocked signal inverter 41, 42 and a corresponding equivalent circuit diagram 43 of a clocked signal inverter. The first exemplary implementation 41 of a clocked signal inverter comprises two transistors 412 and 413 forming a switching element, and two transistors 414 and 415 forming a (continuous) inverter element. The second exemplary implementation 42 of a clocked signal inverter comprises two transistors 422 and 423 forming a switching element which is integrated into a (continuous) inverter element comprising two transistors 421 and 424. The clocked signal inverter may be a high-speed form of a flip-flop and, of course, any other form of flip-flop can be used instead.

Figure 5:
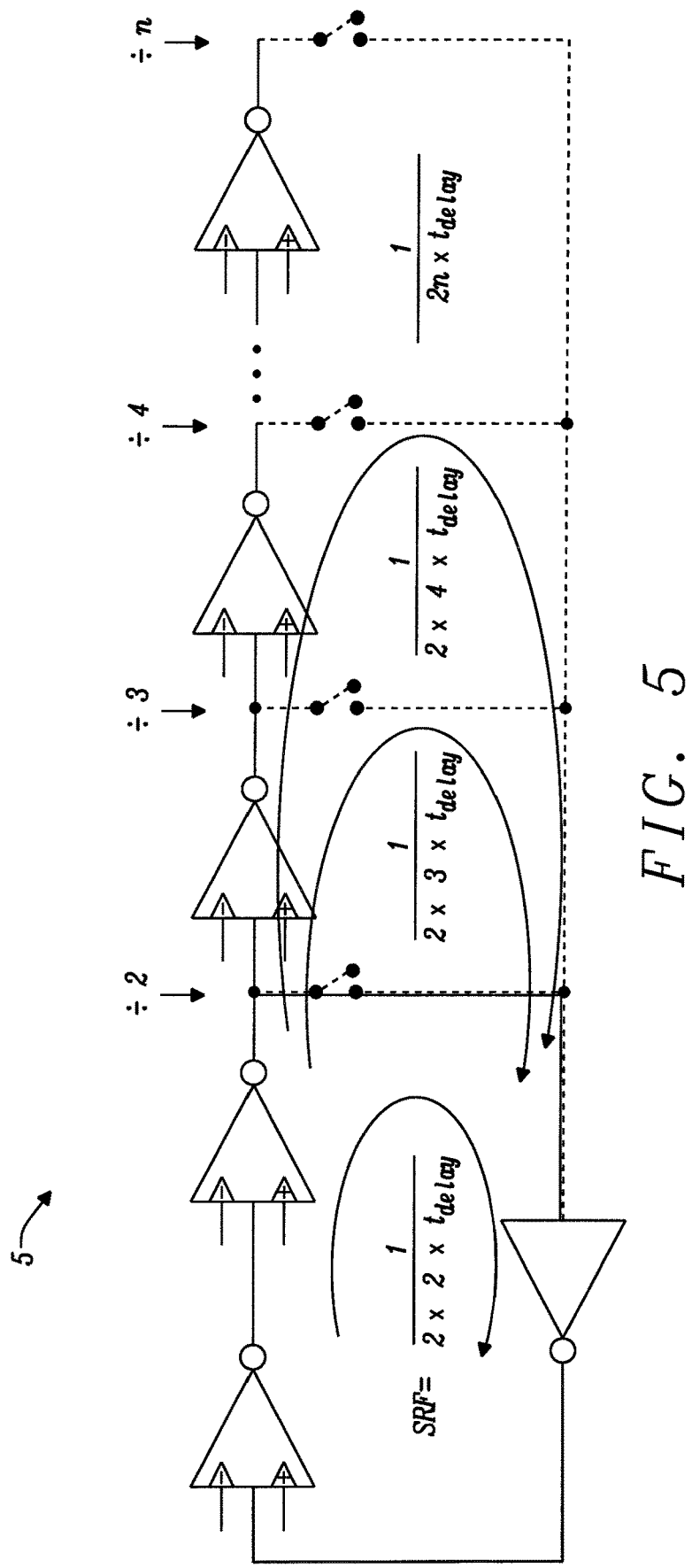
FIG. 5 shows a schematic circuit diagram of a programmable frequency divider unit.

One general idea presented in this document is to extend the discussed divide-by-2 divider of FIG. 3 with clocked inverters into a programmable divider with multiple even and odd division ratios. FIG. 5 shows a schematic circuit diagram of such a programmable frequency divider unit 5. The self-resonance frequency SRF may be determined by the delay of the clocked inverters. When biased, they are comparatively much slower than normal inverters. So, their delay will be dominating.

Figure 6:
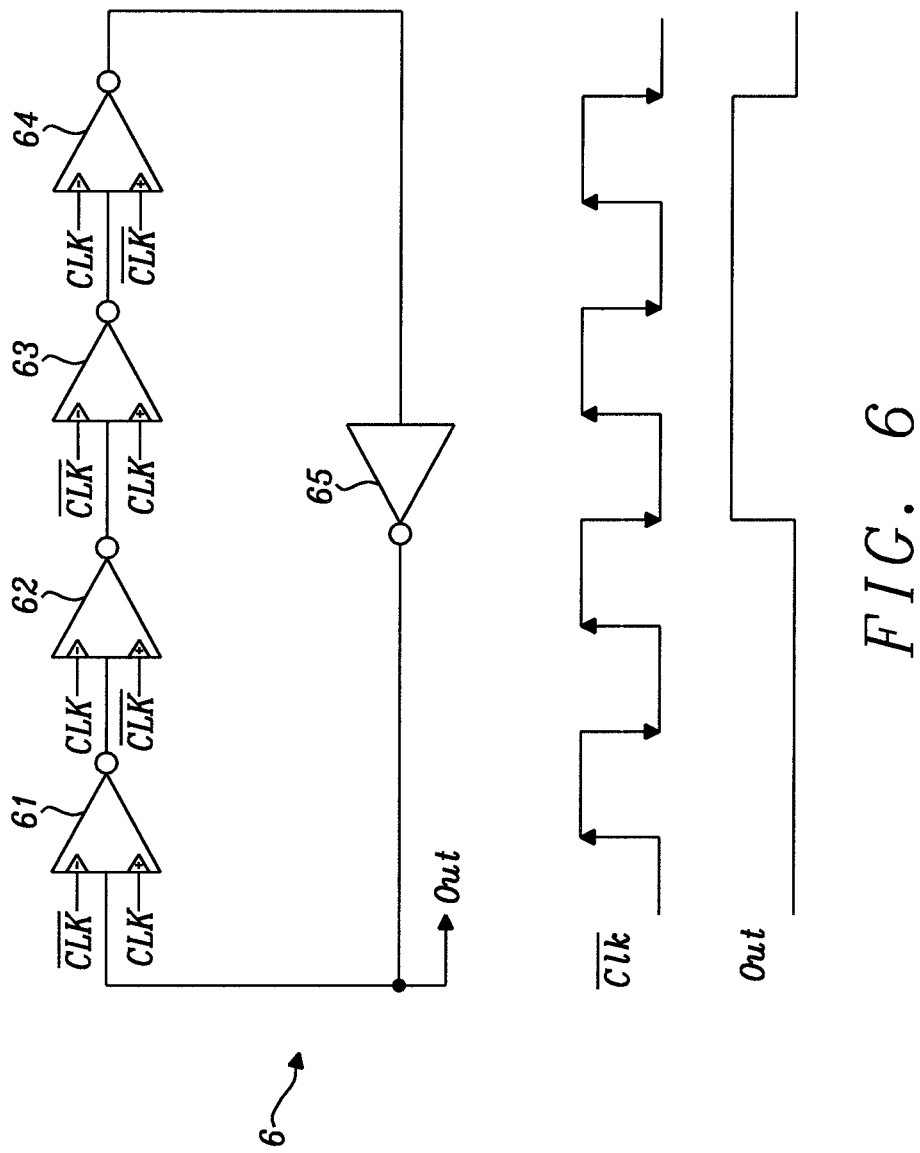
FIG. 6 shows an exemplary frequency divider unit with a division ratio of 4.

FIG. 6 shows an exemplary frequency divider unit 6 with a division ratio of 4. It comprises a first clocked signal inverter 61, a second clocked signal inverter 62, a third clocked signal inverter 63, a fourth clocked signal inverter 64, and a continuously operating signal inverter 65. Let's assume the output "Out"='O'. The rising edges of the $\overline{CLK}$ signal will trigger the first 61 and the third 63 clocked inverters and the falling edges of the $\overline{CLK}$ signal will trigger the second 62 and the fourth 64 clocked inverters. This means that it will take 4 $\overline{CLK}$ signal-events (=toggle from 0 to 1 or from 1 to 0) to convert the "Out"='0' signal into a "Out"='1' signal. At this, the first 61 and the third 63 clocked inverters are 'the second 62 and the fourth 64 clocked inverters and vice versa. This principle will work for all even mode frequency divider ratios.

Put in yet other words, the frequency divider unit 6 generates, using the first 61 and the third 63 clocked signal inverter, a first and a third intermediate signal, respectively, when a falling edge of the oscillating signal occurs CLK, and to generate, using the second 62 and fourth 64 clocked signal inverter, the second and the fourth intermediate signal, respectively, when a rising edge of the oscillating signal occurs.

Figure 7:
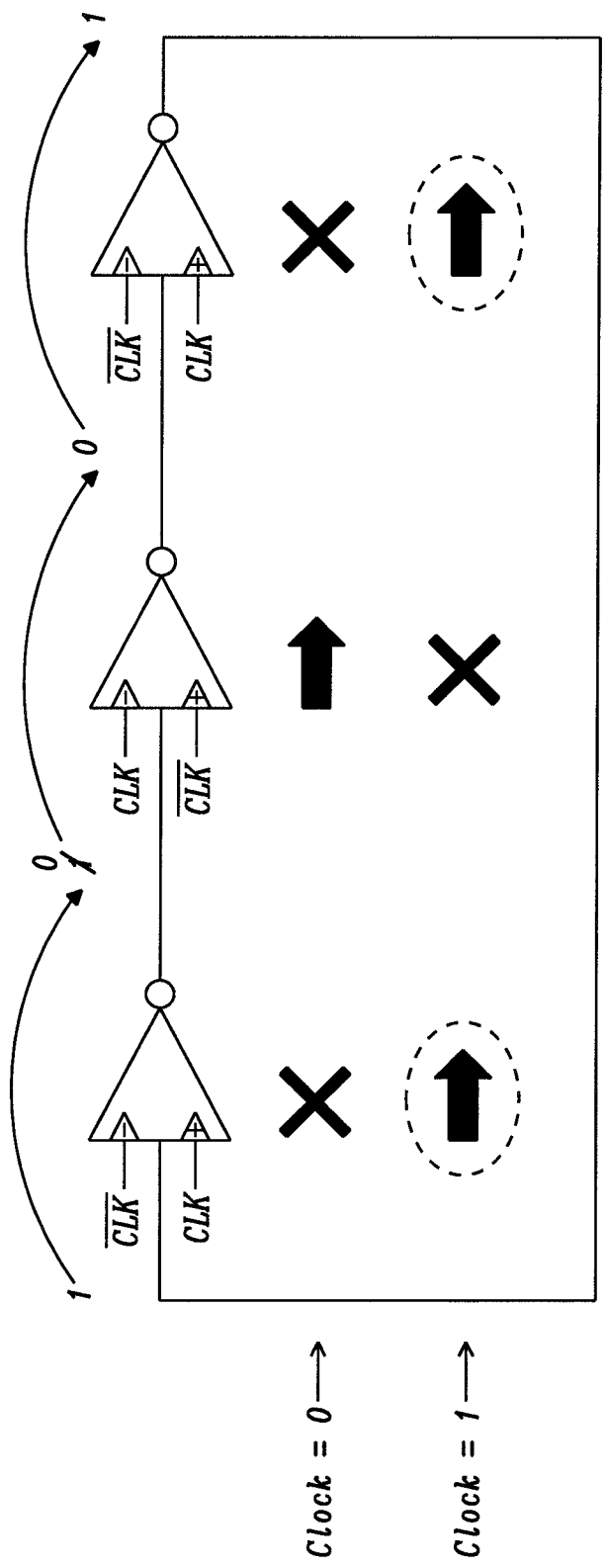
FIG. 7 shows an exemplary frequency divider unit with 3 clocked signal inverters.
Figure 8:
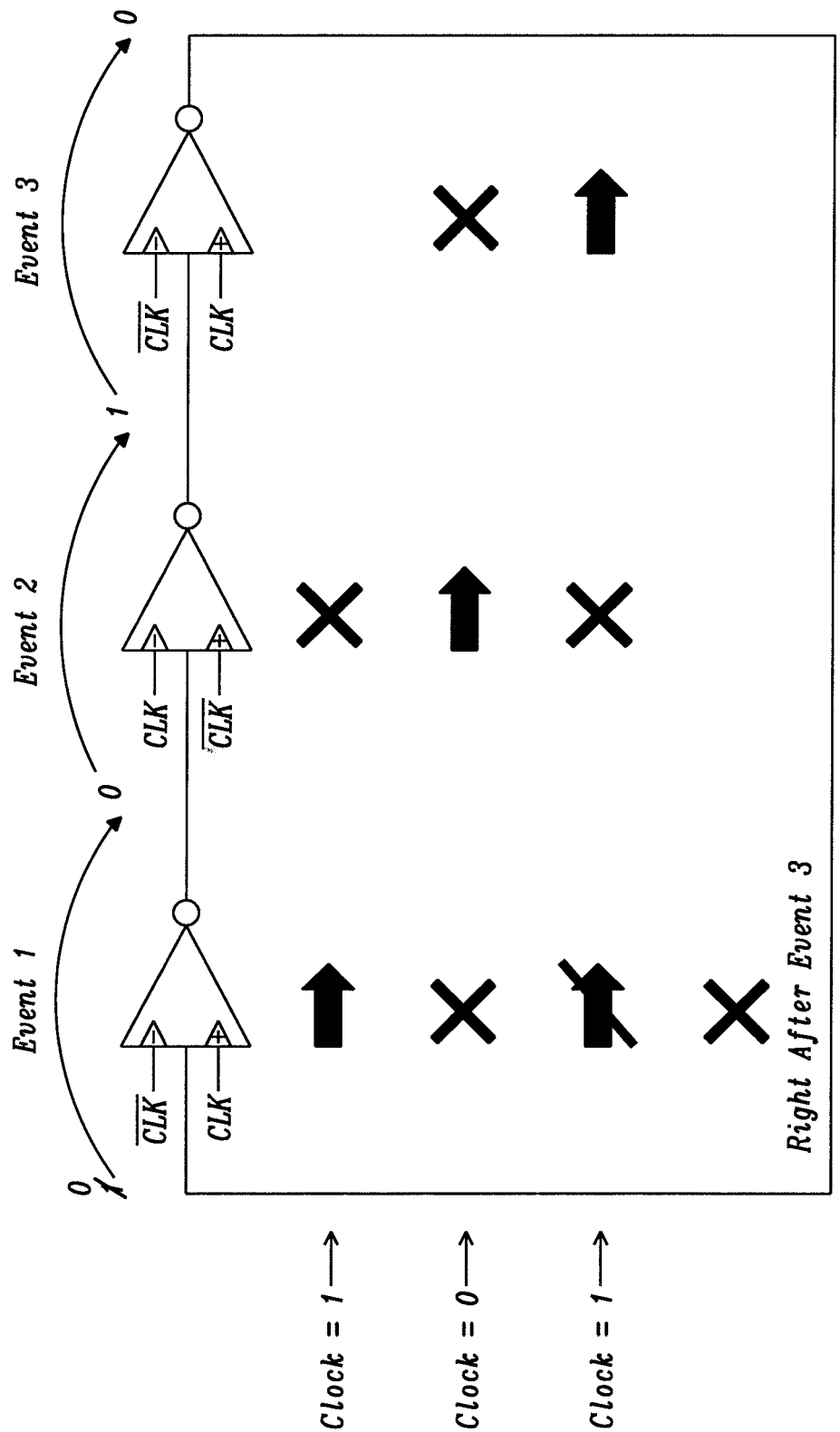
FIG. 8 shows ab exemplary frequency divider unit with 3 clocked signal inverters and adaptive activation of the clocked signal inverters.

FIG. 7 shows an exemplary frequency divider unit with 3 clocked signal inverters. In this example, the odd number of cascaded clocked signal inverters in the forward path will cause two consecutive inverters to be clocked at the same time. This topology with "2n+1" inverters will have a frequency division ratio of "2n", which is similar like a topology of "2n" inverters. It behaves basically like a divide-by-2 divider. The clocking of two consecutive inverters at the same time can be prevented by swapping the clock inputs of all clocked inverters at the right time. This clock swapping is indicated in FIG. 8 for the first clocked inverter. As can be seen from FIG. 8, the clock inputs may be swapped at the right time.

Figure 9:
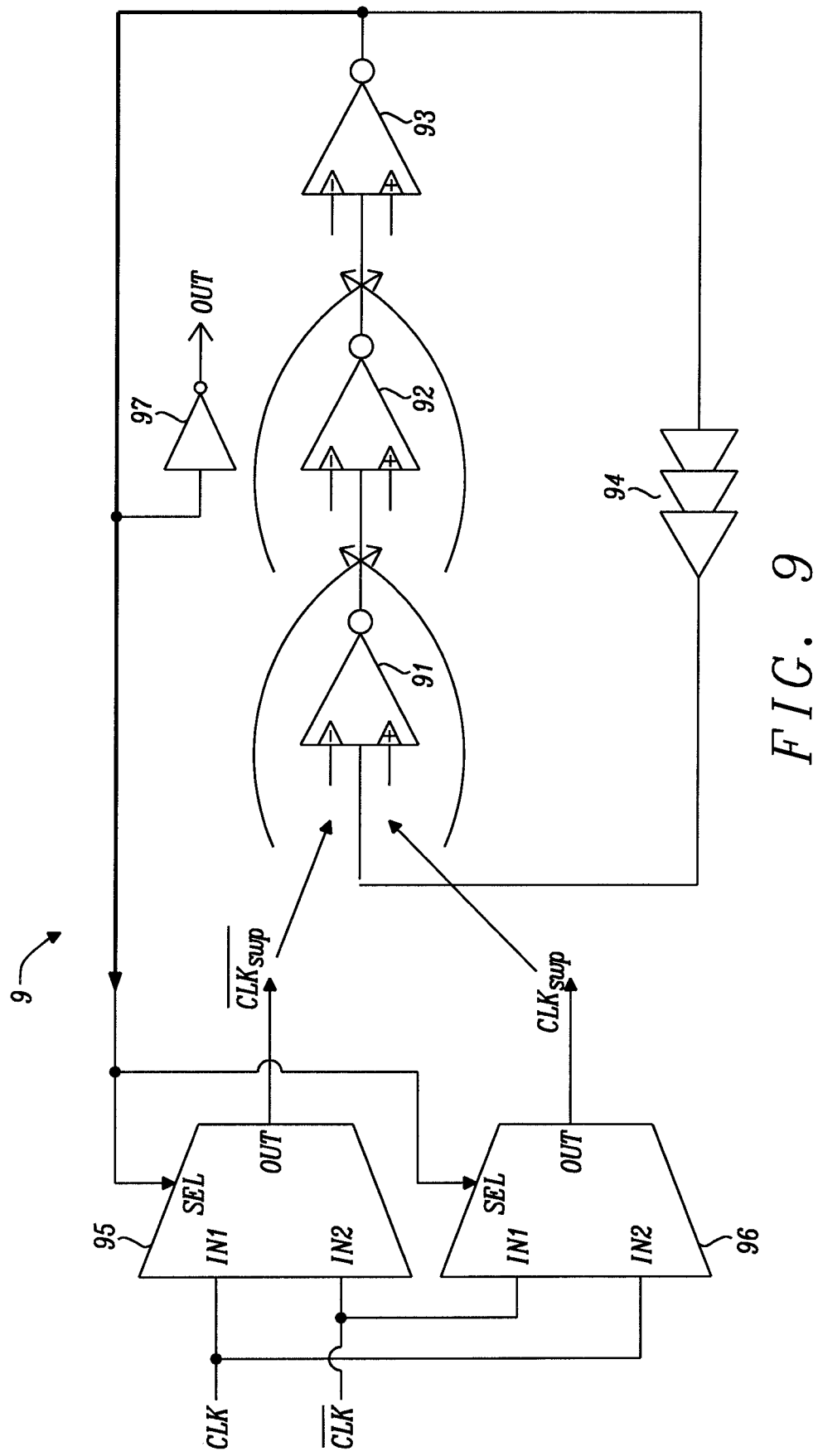
FIG. 9 shows an exemplary frequency divider unit with a division ratio of 3.
Figure 10:
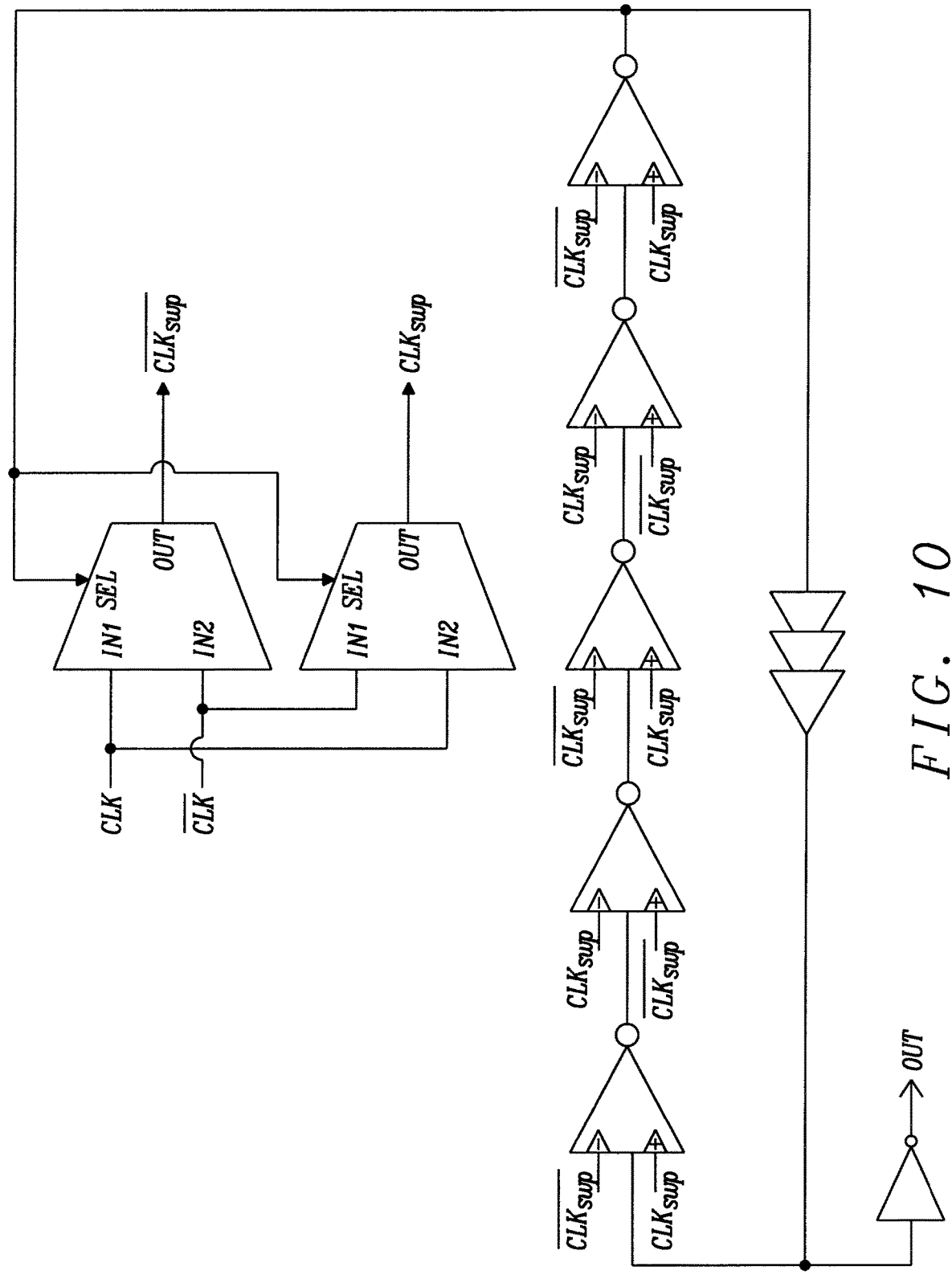
FIG. 10 shows an exemplary frequency divider unit with a division ratio of 5.

FIG. 9 shows an exemplary frequency divider unit 9 with a division ratio of 3. It comprises 3 clocked signal inverters 91, 92, and 93, a variable delay element 94, a continuously operating signal inverter 97 at the output of the exemplary frequency divider unit 9, and 2 multiplexers 95 and 96. FIG. 9 illustrates one of a plurality of possibilities for a clock swapping topology for a divide-by-3 frequency divider. The clock swapping can happen at an event of any arbitrary clocked signal inverter. In this example, the clock swap is triggered by the last clocked signal inverter 93. This output signal of the last clocked signal inverter 93 will cause the two multiplexers 95, 96 to swap the CLK and $\overline{CLK}$ signals. The clock swap should preferably happen before the next clocked signal inverter input is changed, so setup time is important. Thus, some delay in the feedback path may be required to compensate for the delay introduced by the multiplexers. This is achieved in FIG. 9 with the help of variable delay element 94. It may however have a negative effect on the self-resonance frequency. This topology for odd division ratio can be extended. An example for a divide-by-5 frequency division is given in FIG. 10. In FIG. 10, an event at the rightmost clocked signal inverter is used for clock swapping.

Figure 11:
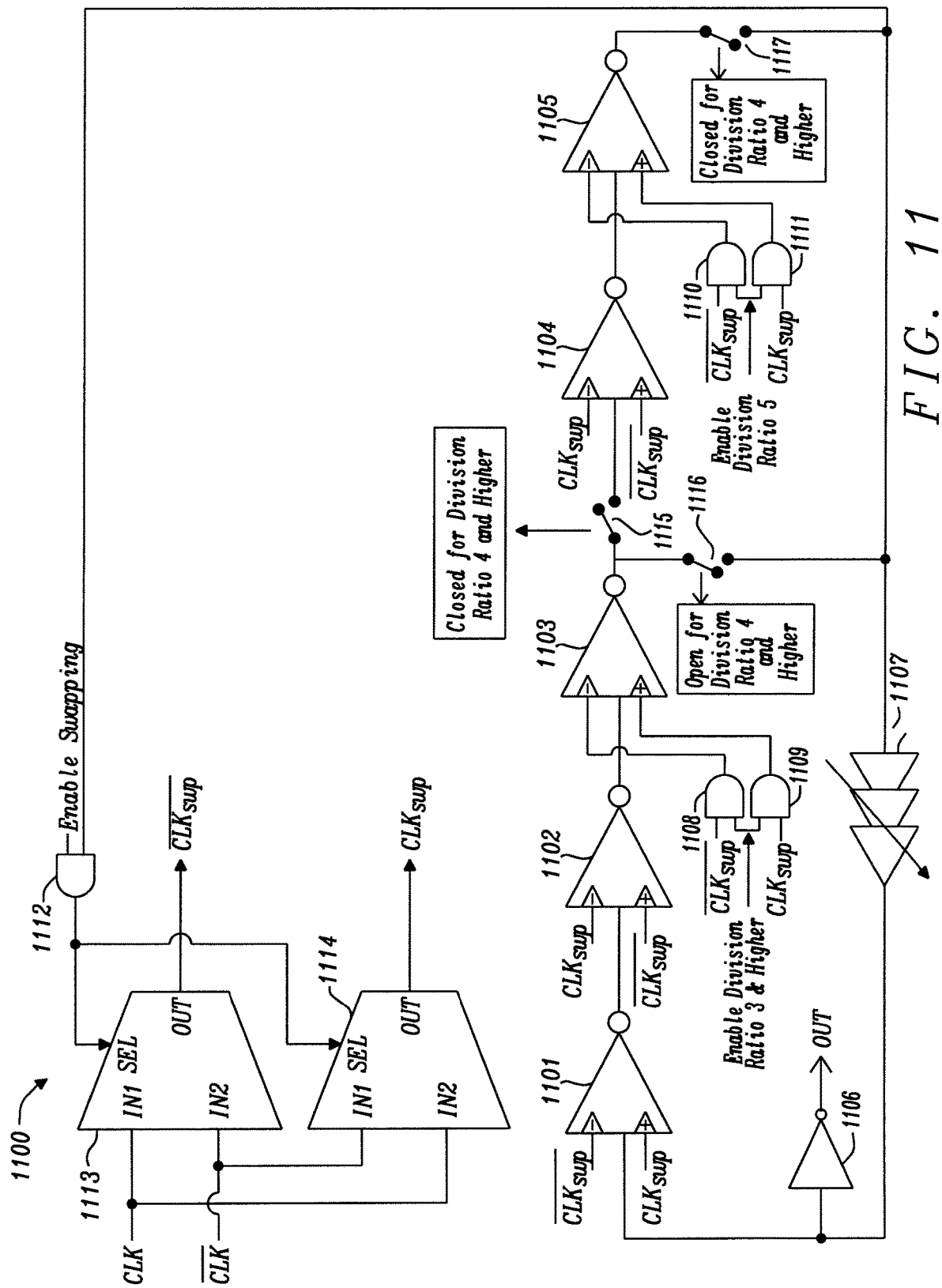
FIG. 11 shows an exemplary programmable frequency divider unit with division ratios 2, 3, 4 and 5.

An exemplary programmable topology 1100 that will allow a frequency division ratio of 2, 3, 4 and 5 is depicted in FIG. 11. It comprises four clocked signal inverters 1101, 1102, 1103, 1104, and 1105, a continuously operating signal inverter 1106, a programmable delay element 1107, five logical AND-gates 1108, 1109, 1110, 1111, and 1112, two multiplexer units 1113 and 1114, and three switching elements 1115, 1116, 1117. The purpose of programmable delay line 1107 is to control the delay of the loop, and to provide enough time for the clock-swap action to be completed.

Figure 12:
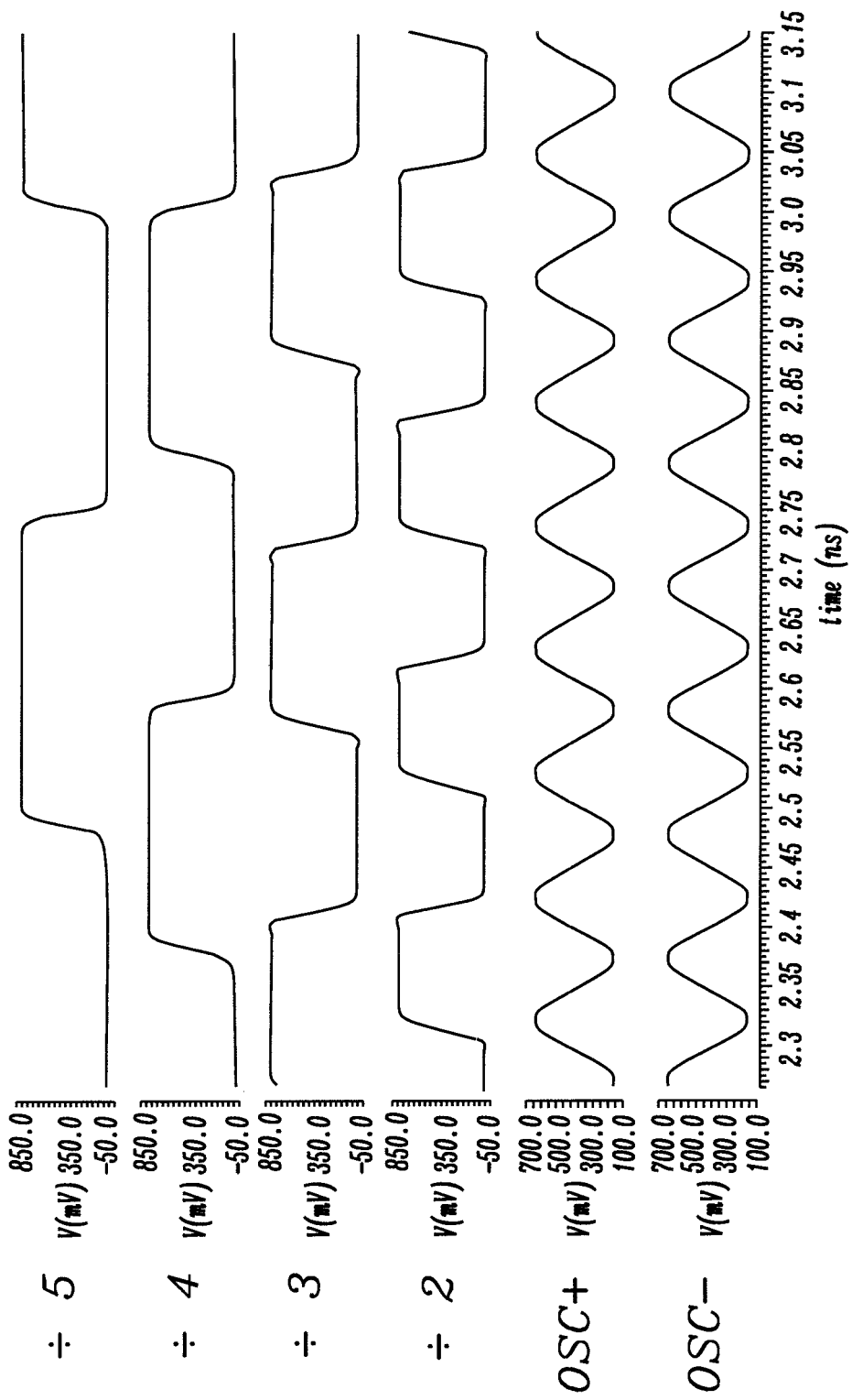
FIG. 12 shows simulation results.

Some transient simulation results can be found in FIG. 12. It depicts the input signal of the programmable divider (osc+ and osc−, which correspond to the CLK and $\overline{CLK}$ signals) and the output signals for frequency division ratios of 2, 3, 4 and 5, respectively. It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A frequency divider unit, wherein the frequency divider unit is configured to receive an oscillating signal and to generate, at an output of the frequency divider unit, a frequency-divided oscillating signal, the frequency divider unit comprising:

a first clocked signal inverter configured to update, clocked based on the oscillating signal, a first intermediate signal, wherein said first intermediate signal is an inverted version of a binary signal at an input of the first clocked signal inverter;

a second clocked signal inverter configured to update, clocked based on the oscillating signal, a second intermediate signal at an output of the second clocked signal inverter, wherein said second intermediate signal is an inverted version of the first intermediate signal; and a third clocked signal inverter coupled between the output of the second clocked signal inverter and the input of the first clocked signal inverter; wherein the third clocked signal inverter is configured to update, clocked based on the oscillating signal, a third intermediate signal at an output of the third clocked signal inverter, wherein said third intermediate signal is an inverted version of the second intermediate signal;

wherein the frequency divider unit further comprises a control unit configured to receive the third intermediate signal and to determine, based on said third intermediate signal, whether the oscillating signal or an inverted oscillating signal is forwarded to the first clocked signal inverter, wherein the inverted oscillating signal is an inverted version of the oscillating signal, and wherein the first clocked signal inverter is configured to update, if the oscillating signal is forwarded by the control unit, the first intermediate signal when the oscillating signal reaches a first signal value, or to update, if the inverted oscillating signal is forwarded by the control unit, the first intermediate signal when the inverted oscillating signal reaches a second signal value.

2. The frequency divider unit according to claim 1, wherein said control unit comprises a multiplexer configured to receive both the oscillating signal and the inverted oscillating signal, and to determine, based on the third intermediate signal, whether the oscillating signal or the inverted oscillating signal is forwarded to the first clocked signal inverter.

3. The frequency divider unit according to claim 1, further comprising a variable delay unit which is coupled between the third clocked signal inverter and the first clocked signal inverter.

4. A method for dividing a frequency, the method comprising:

receiving an oscillating signal;

updating, by a first clocked signal inverter, clocked based on the oscillating signal, a first intermediate signal, wherein said first intermediate signal is an inverted version of a binary signal at an input of the first clocked signal inverter;

updating, by a second clocked signal inverter, clocked based on the oscillating signal, a second intermediate signal at an output of the second clocked signal inverter, wherein said second intermediate signal is an inverted version of the first intermediate signal;

updating, by a third clocked signal inverter which is coupled between the output of the second clocked signal inverter and the input of the first clocked signal inverter, clocked based on the oscillating signal, a third intermediate signal at an output of the third clocked signal inverter, wherein said third intermediate signal is an inverted version of the second intermediate signal;

receiving, by a control unit, the third intermediate signal:

determining, by the control unit, based on said third intermediate signal, whether the oscillating signal or an inverted oscillating signal is forwarded to the first clocked signal inverter, wherein the inverted oscillating signal is an inverted version of the oscillating signal;

updating, by the first clocked signal inverter, if the oscillating signal is forwarded by the control unit, the first intermediate signal when the oscillating signal reaches a first signal value; and updating, by the first clocked signal inverter, if the inverted oscillating signal is forwarded by the control unit, the first intermediate signal when the inverted oscillating signal reaches a second signal value.

5. The method according to claim 4, wherein said control unit comprises a multiplexer, wherein said method comprises receiving, by said multiplexer, both the oscillating signal and the inverted oscillating signal; and determining, by said multiplexer, based on the third intermediate signal, whether the oscillating signal or the inverted oscillating signal is forwarded to the first clocked signal inverter.

6. The method according to claim 4, comprising coupling a variable delay unit between the third clocked signal inverter and the first clocked signal inverter.

7. A method for dividing a frequency, the method comprising:

receiving an oscillating signal;

updating, by a first clocked signal inverter, clocked based on the oscillating signal, a first intermediate signal, wherein said first intermediate signal is an inverted version of a binary signal at an input of the first clocked signal inverter;

updating, by a second clocked signal inverter, clocked based on the oscillating signal, a second intermediate signal at an output of the second clocked signal inverter, wherein said second intermediate signal is an inverted version of the first intermediate signal;

updating, by a third clocked signal inverter which is coupled between the output of the second clocked signal inverter and the input of the first clocked signal inverter, clocked based on the oscillating signal, a third intermediate signal at an output of the third clocked signal inverter, wherein said third intermediate signal is an inverted version of the second intermediate signal;

switching, by a state control unit, between a first switching state and a second switching state, wherein in the first switching state the first and the third clocked signal inverter are clocked by the oscillating signal such that both the first and the third clocked signal inverter update the first and the third intermediate signal, respectively, when the oscillating signal reaches a threshold signal value, and the second clocked signal inverter is clocked by an inverted oscillating signal such that the second clocked signal inverter updates the second intermediate signal when the inverted oscillating signal reaches the threshold signal value, and wherein in the second switching state the first and the third clocked signal inverter are clocked by the inverted oscillating signal such that both the first and the third clocked signal inverter update the first and the third intermediate signal, respectively, when the inverted oscillating signal reaches the threshold signal value, and the second clocked signal inverter is clocked by the oscillating signal such that the second clocked signal inverter updates the second intermediate signal when the oscillating signal reaches the threshold signal value, wherein the inverted oscillating signal is an inverted version of the oscillating signal.

8. A frequency divider unit, wherein the frequency divider unit is configured to receive an oscillating signal and to generate, at an output of the frequency divider unit, a frequency-divided oscillating signal, the frequency divider unit comprising:

a first clocked signal inverter configured to update, clocked based on the oscillating signal, a first intermediate signal, wherein said first intermediate signal is an inverted version of a binary signal at an input of the first clocked signal inverter;

a second clocked signal inverter configured to update, clocked based on the oscillating signal, a second intermediate signal at an output of the second clocked signal inverter, wherein said second intermediate signal is an inverted version of the first intermediate signal; and a third clocked signal inverter coupled between the output of the second clocked signal inverter and the input of the first clocked signal inverter; wherein the third clocked signal inverter is configured to update, clocked based on the oscillating signal, a third intermediate signal at an output of the third clocked signal inverter, wherein said third intermediate signal is an inverted version of the second intermediate signal;

further comprising a state control unit configured to switch between a first switching state and a second switching state, wherein in the first switching state the first and the third clocked signal inverter are clocked by the oscillating signal such that both the first and the third clocked signal inverter are configured to update the first and the third intermediate signal, respectively, when the oscillating signal reaches a threshold signal value, and the second clocked signal inverter is clocked by an inverted oscillating signal such that the second clocked signal inverter is configured to update the second intermediate signal when the inverted oscillating signal reaches the threshold signal value, and wherein in the second switching state the first and the third clocked signal inverter are clocked by the inverted oscillating signal such that both the first and the third clocked signal inverter are configured to update the first and the third intermediate signal, respectively, when the inverted oscillating signal reaches the threshold signal value, and the second clocked signal inverter is clocked by the oscillating signal such that the second clocked signal inverter is configured to update the second intermediate signal when the oscillating signal reaches the threshold signal value, wherein the inverted oscillating signal is an inverted version of the oscillating signal.

* * * * *